US007504680B2

(12) United States Patent
Arisumi et al.

(10) Patent No.: US 7,504,680 B2
(45) Date of Patent: Mar. 17, 2009

(54) SEMICONDUCTOR DEVICE AND MASK PATTERN

(75) Inventors: Osamu Arisumi, Yokohama (JP);
Yoshinori Kumura, Yokohama (JP);
Kazuhiro Tomioka, Tsukuba (JP);
Ulrich Egger, Dresden (DE); Haoran Zhuang, Wallkill, NY (US); Bum-ki Moon, Poughkeepsie, NY (US)

(73) Assignees: Kabushiki Kaisha Toshiba, Tokyo (JP);
Infineon Technologies AG, Munich (DE)

( * ) Notice: Subject to any disclaimer, the term of this patent is extended or adjusted under 35 U.S.C. 154(b) by 155 days.

(21) Appl. No.: 11/107,750

(22) Filed: Apr. 18, 2005

(65) Prior Publication Data
US 2006/0231876 A1 Oct. 19, 2006

(51) Int. Cl.
*H01L 31/062* (2006.01)
*H01L 31/113* (2006.01)

(52) U.S. Cl. ............... 257/293; 257/532; 438/240; 438/241; 438/396; 438/720

(58) Field of Classification Search ............ 257/295, 257/532; 438/396
See application file for complete search history.

(56) References Cited

U.S. PATENT DOCUMENTS

| 6,057,081 A * | 5/2000 | Yunogami et al. ........... 430/313 |
| 6,326,218 B1 * | 12/2001 | Yunogami et al. .............. 438/3 |
| 6,351,006 B1 * | 2/2002 | Yamakawa et al. .......... 257/310 |
| 6,432,835 B1 * | 8/2002 | Yunogami et al. ........... 438/720 |
| 6,451,665 B1 * | 9/2002 | Yunogami et al. ........... 438/397 |
| 6,835,665 B2 * | 12/2004 | Mise et al. .................. 438/706 |
| 6,924,521 B2 * | 8/2005 | Arisumi et al. ............. 257/295 |
| 2001/0041416 A1 * | 11/2001 | Torii et al. .................. 438/396 |
| 2004/0150923 A1 * | 8/2004 | Egger et al. .................... 361/15 |
| 2005/0006685 A1 * | 1/2005 | Natsume et al. ............. 257/296 |
| 2006/0071258 A1 * | 4/2006 | Tomioka et al. ............. 257/296 |

OTHER PUBLICATIONS

T. Yunogami and T. Kumihashi, "Sub-quarter-micron Pt etching technology using round head EB resist," 1998 International Microprocesses and Nanotechnology Conference, Jul. 13-16, 1998, pp. 340-341.*

(Continued)

*Primary Examiner*—Ori Nadav
*Assistant Examiner*—Meiya Li
(74) *Attorney, Agent, or Firm*—Oblon, Spivak, McClelland, Maier & Neustadt, P.C.

(57) ABSTRACT

A semiconductor device according to an aspect of the invention includes a semiconductor substrate, and a capacitor that is provided above the semiconductor substrate and is configured such that a dielectric film is sandwiched between a lower electrode and an upper electrode, the dielectric film being formed of an $ABO_3$ perovskite-type oxide that includes at least one of Pb, Ba and Sr as an A-site element and at least one of Zr, Ti, Ta, Nb, Mg, W, Fe and Co as a B-site element, wherein a radius of curvature of a sidewall of the capacitor, when viewed from above or in a film thickness direction, is 250 [nm] or less, and a length of an arc with the radius of curvature is $\{250 [nm] \times \pi/6 [rad]\}$ or less.

2 Claims, 4 Drawing Sheets

OTHER PUBLICATIONS

K. Kumura et al., "A SrRuO3/IrO2 top electrode FeRAM with Cu BEOL Process for embedded memory of 130 nm generation and beyond," Proceedings of ESSDERC, Grenoble, France, 2005, pp. 557-560.*

Takashi Yunogami, et al. "Sub-Quarter-Micron Pt Etching Technology Using Electron Beam Resist with Round-Head"; Microprocess and Nano-Technology; Jpn. J. Appl. Phys.; 1998; vol. 37; pp. 6934-6938.

* cited by examiner

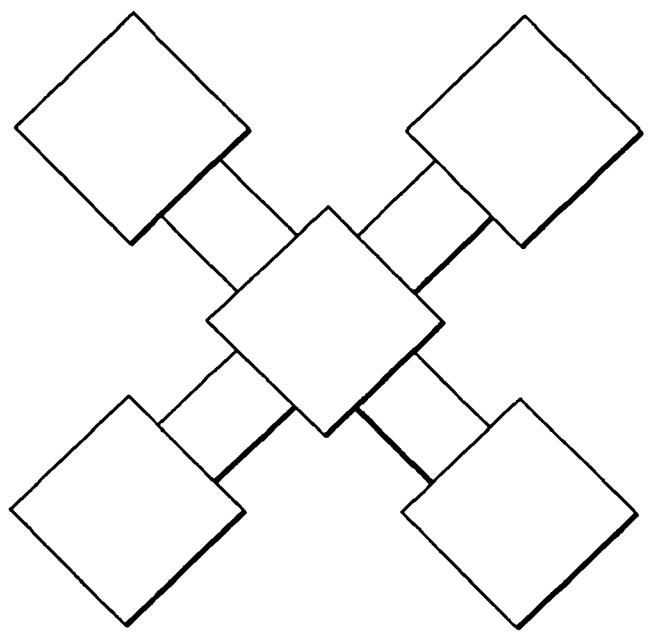
F I G. 1
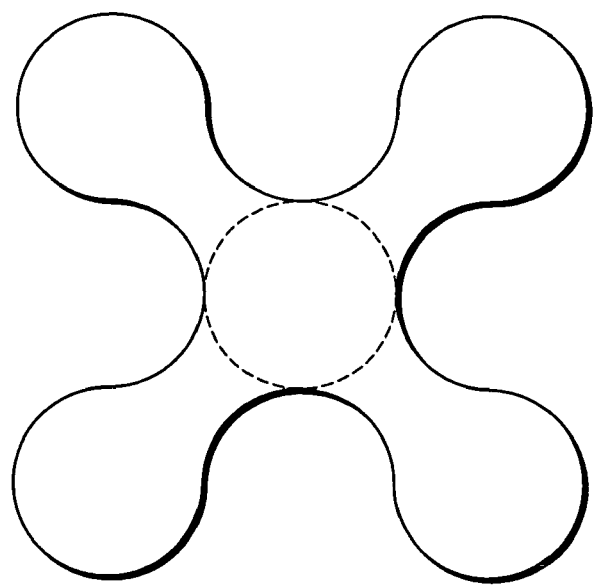
F I G. 2

Embodiment

SEMICONDUCTOR DEVICE AND MASK PATTERN

BACKGROUND OF THE INVENTION

1. Field of the Invention

The present invention relates generally to a semiconductor device and a mask pattern, and more particular to processing of a capacitor of a semiconductor device.

2. Description of the Related Art

In recent years, there has been a demand for reduction in power consumption and enhancement in operation speed of LSIs (Large Scale Integrated Circuits), and it has become important to add a nonvolatile function to a memory. In addition, introduction of new materials is indispensable in order to enhance the performance and increase the number of functions. Various novel materials have been incorporated in modern devices. For example, special attention has been paid to a nonvolatile ferroelectric memory (ferroelectric RAM) in which a ferroelectric thin film is used as an inter-electrode insulation film of a capacitor, and the development of the nonvolatile ferroelectric memory is proceeding rapidly.

Such novel materials include a relatively large number of materials that contain an element, which diffuses in a fabrication step, or an element, which easily reacts with some other material. A typical composite oxide, which is used as a material of a ferroelectric film, is PZT (Pb(Zr, Ti)$O_3$). Lead (Pb) and titanium (Ti), which are contained in PZT, are instances of such elements.

There may be a case where a part of elements that constitute an underlayer film diffuses and reacts in a PZT film, which is an amorphous film, in a crystallizing heat treatment step, leading to degradation in ferroelectricity or in leak current characteristic. In addition, constituent elements in the amorphous film may diffuse into the underlayer film in the crystallizing heat treatment step, and constituent elements of the PZT crystal film may become defective at an interface between the PZT film and the underlayer film. Furthermore, at an initial stage of the crystallizing heat treatment, a constituent element in the amorphous film may react with a constituent element in the underlayer film, and the film quality of the underlayer electrode itself may not merely deteriorate and increase the resistance thereof, but also the crystallinity of the underlayer film may deteriorate. Consequently, the crystal growth of the amorphous film may be hindered. As a result, these factors considerably degrade the reliability in ferroelectricity and electrical characteristic of the PZT film.

Moreover, in the heat treatment step for the ferroelectric film, high temperatures of, e.g. 600 to 700° C., have widely been used. The electrode film itself needs to withstand such high temperatures from the standpoint of both electrical and structural aspects. In short, the electrode film is required to have a low resistance and a high melting point. These conditional constraints pose a difficult problem in technical development of the fabrication process. The same drawbacks, as mentioned above, may occur not only in the method of forming an ordinary ferroelectric capacitor, wherein a film is first grown at low temperatures and then the film is subjected to high-temperature heat treatment to form a crystalline insulating film, but also at a time of forming a ferroelectric film while crystallizing the film or at a time of performing heat treatment after formation of a ferroelectric capacitor.

Since the capacitor is an important component for the operation of the memory, the thermal/chemical stability of the capacitor is to be sought from the above-mentioned standpoint. However, conversely speaking, to seek the thermal/chemical stability makes it difficult to carry out capacitor processing that makes use of reactivity such as RIE (Reactive Ion Etching). A major processing technology in the existing fabrication process is dry etching. A halogen-based compound is typically used as a reactive gas (or etching gas or etchant gas) etchant for the dry etching, thereby performing physical/chemical processing.

In the processing technology for the ferroelectric memory, however, the melting points/boiling points of the constituent elements of the electrode film and the halogen-based compound of the etchant are very high. Thus, it is very difficult to execute etching unless the physical etching factors are enhanced by assisting with additional energy, for example, by heating the substrate or applying a high bias.

In many cases, use is made of a method of enhancing factors of physical etching by using Ar as a main reactive gas (or main etching gas or main etchant gas) main etchant. In such cases, etching damage occurs and selectivity to a resist lowers. Moreover, as illustrated in FIG. 6, such a serious problem arises that an etched matter 72 re-adheres to sidewalls of a capacitor 71. The re-adhered residual matter is called "fence", which may lead to an increase in leak current, a decrease in breakdown voltage, degradation in reducing ferroelectric material due to degradation in step coverage of a cover film such as Al2O3, and a decrease in surface planarity in a Chemical Mechanical Polish (CMP) step that is executed after deposition of an interlayer insulation film. In the meantime, a ferroelectric film of, e.g. PZT is very susceptible to acids, and its ferroelectricity deteriorates due to moisture. Thus, the ferroelectric film is not suited to processing by wet etching.

BRIEF SUMMARY OF THE INVENTION

According to an aspect of the invention, there is provided a semiconductor device comprising: a semiconductor substrate; and a capacitor that is provided above the semiconductor substrate and is configured such that a dielectric film is sandwiched between a lower electrode and an upper electrode, the dielectric film being formed of an $ABO_3$ perovskite-type oxide that includes at least one of Pb, Ba and Sr as an A-site element and at least one of Zr, Ti, Ta, Nb, Mg, W, Fe and Co as a B-site element, wherein a radius of curvature of a sidewall of the capacitor, when viewed from above or in a film thickness direction, is 250 [nm] or less, and a length of an arc with the radius of curvature is {250 [nm]×π/6 [rad]} or less.

According to another aspect of the invention, there is provided a mask pattern that is configured such that a radius of curvature of a sidewall of a capacitor, which is formed by sandwiching a dielectric film between a lower electrode and an upper electrode, is set at 250 [nm] or less and a length of an arc with the radius of curvature is set at {250 [nm]×π/6 [rad]} or less.

BRIEF DESCRIPTION OF THE SEVERAL VIEWS OF THE DRAWING

FIG. 1 is a top view of a mask pattern of a photoresist according to an embodiment of the present invention;

FIG. 2 is a top view of a PZT capacitor that is processed using the mask pattern of the photoresist according to the embodiment;

DETAILED DESCRIPTION OF THE INVENTION

Figure 3A:
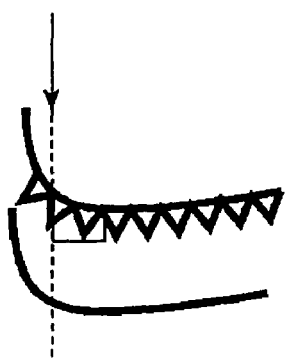
FIGS. 3A to 3C show sidewall corner portions of a general PZT capacitor, as viewed in an obliquely downward direction, according to the embodiment.

An embodiment of the present invention will now be described with reference to the accompanying drawings.

In this embodiment, when a capacitor that is provided in a semiconductor memory is processed by etching, a residual matter (fence) is prevented from forming on a sidewall.

To begin with, a process of fabricating a ferroelectric capacitor using a PZT film is described. An underlayer oxide film of, e.g. Low Pressure—TetraEthOxy Silane (LP-TEOS) is provided on a semiconductor silicon substrate. A Ti film with a thickness of 10 nm and a Pt film with a thickness of 100 nm are successively formed on the underlayer oxide film by a sputtering process using a film forming apparatus. Thus, a lower electrode film is obtained. The film formation conditions of the DC sputter for this lower electrode film are as follows. As regards the Ti film, the input power is 1 kW, the time for film formation is 7 seconds, and an Ar gas atmosphere is used for sputtering. As regards the Pt film, the input power is 3 kW, the time for film formation is 20 seconds, and an Ar gas atmosphere is used for sputtering.

On the lower electrode film, a PZT film, which is an amorphous film, is deposited at room temperature by an RF magnetron sputtering process. Then, the amorphous PZT film is subjected to rapid temperature-increase heat treatment at 600° C. for 30 seconds in an oxygen atmosphere using an RTA (Rapid Thermal Anneal) apparatus, thereby crystallizing the amorphous film. The sputtering conditions for forming the amorphous PZT film are as follows. The input power is 1.5 kW, the time for film formation is 72 seconds, and an Ar gas atmosphere is used for sputtering. The conditions for RTA are as follows. In an oxygen atmosphere, the rate of temperature increase is set at a high value, i.e. 10° C./sec. or more, and RTA is performed for 30 seconds at a maximum temperature of 600° C. A PZT target, which is used for sputtering, is a high-density sintered one with a composition of $(Pb_{1.07}, La_{0.03})(Zr_{0.4}, Ti_{0.6})O_3$. The successive steps of the formation of the amorphous PZT film and the crystallizing anneal are repeated twice, whereby a PZT crystalline film with a total thickness of 130 nm is formed. Subsequently, a Pt film with a thickness of 50 nm is formed as an upper electrode film. On the upper electrode film, a silicon oxide film is deposited.

Further, a photoresist mask is deposited. The photoresist is patterned by exposure so that the silicon oxide film may become a hard mask for processing the upper electrode film and the PZT film. Using the patterned photoresist, the oxide film is etched. The hard mask may be formed of titanium, titanium nitride, titanium oxide, zirconium oxide, aluminum oxide, aluminum oxynitride, hafnium oxide, carbon, tungsten, etc. In addition to platinum (Pt), noble metals such as iridium (Ir), ruthenium (Ru) and palladium (Pd) may be used for the electrode films.

The sample, which is thus formed, is conveyed to a parallel-plate chamber that is capable of executing an etching process. Using the above-mentioned silicon oxide film as a mask, etching is executed under the following conditions. The substrate temperature is 300 to 400° C., the input power is 1 kW, the inside pressure of the chamber is 1 Pa, and the reactive gas (or etching gas or etchant gas) etchant and the flow rate thereof are Cl/BCl3=100 sccm/100 sccm. Thereby, the upper electrode Pt film, the PZT film and a surface portion of the lower electrode Pt film are etched, and a ferroelectric capacitor having a maximum taper angle of 85° at sidewalls is fabricated.

The dielectric film may be formed of, instead of the PZT film, an $ABO_3$ perovskite-type oxide that includes at least one of Pb, Ba and Sr as an A-site element, and at least one of Zr, Ti, Ta, Nb, Mg, W, Fe and Co as a B-site element.

Next, the features of the fabrication process of the PZT capacitor according to the present embodiment are described.

FIG. 1 is a top view of a mask pattern of a photoresist that is used in the present embodiment, and FIG. 2 is a top view of a PZT capacitor that is processed using this mask pattern. In the above-described fabrication process of the ferroelectric capacitor, if a lithography pattern, as shown in FIG. 1, is used as the exposure pattern of the photoresist, a capacitor structure as shown in FIG. 2 is obtained as a result. The mask pattern shown in FIG. 1 has to be defined so that the sidewall of a capacitor that is to be obtained may have a shape that will be described below.

In general, a capacitor, when viewed in an obliquely downward direction, has a rectangular shape. In this case, a great amount of fence is formed on flat sidewalls, except four corner portions. When the electrical characteristics of this capacitor are measured, it is found that the leak current density and breakdown voltage are very high. The same result applies to the case where a noble metal other than Pt, or a stacked film of Pt and another noble metal, is used for the lower electrode.

Figure 3B:
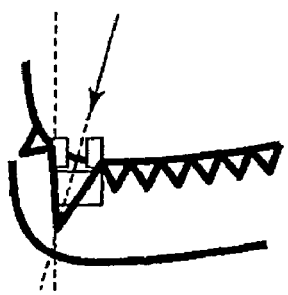

FIGS. 3A and 3B are views that show corner portions of sidewalls of an ordinary PZT capacitor, as viewed in an obliquely downward direction. As indicated by an arrow in FIG. 3A, when etching is executed in a normal direction from above on the corner part of the sidewall of the PZT capacitor, a great amount of fence is formed on the corner part of the sidewall. Similarly, even when etching is executed on the corner part of the sidewall of the PZT capacitor in a slightly obliquely downward direction, as indicated by an arrow in FIG. 3B, a fence is formed on the corner part of the sidewall.

Figure 3C:
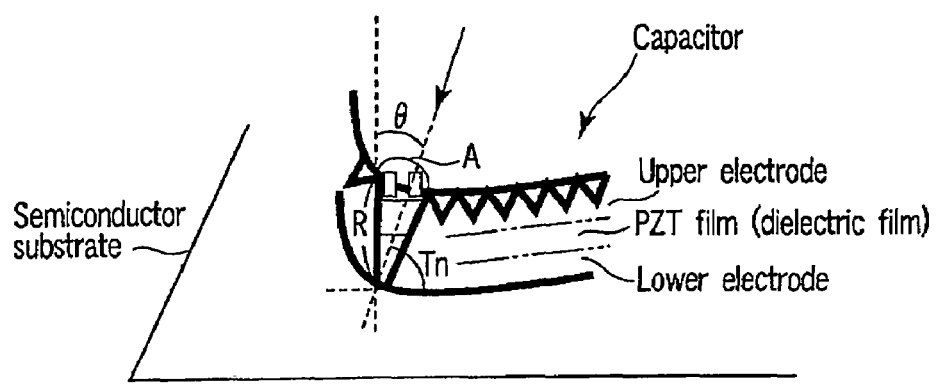

However, as indicated by an arrow in FIG. 3C, if the corner part of the sidewall of the PZT capacitor is etched in an obliquely downward direction with an angle θ of 15° or more to the normal direction, no fence is formed on the corner part of the sidewall. In this case, the taper angle Tn of the formed sidewall, that is, the angle of the sidewall to the planar surface of the semiconductor substrate, is 85° or less, the radius R of curvature of the corner part of the sidewall is 250 [nm] or less, and the length A of an arc with the radius R of curvature is {250 [nm]×π/6 [rad]} or less.

In other words, the mask pattern shown in FIG. 1 has to be defined such that the radius of curvature of the sidewall, at least the corner part of the sidewall, of the PZT capacitor after etching, may become 250 [nm] or less, and the length of the arc with the radius of curvature may become {250 [nm]×π/6 [rad]} or less.

Figure 4A:
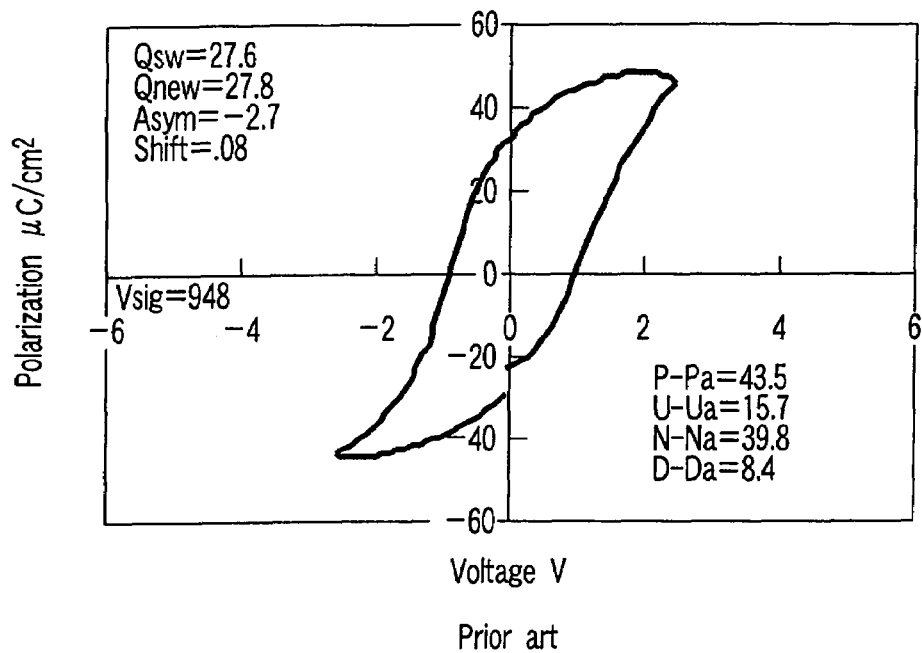
FIGS. 4A and 4B show hysteresis characteristics of a conventional PZT capacitor and the PZT capacitor according to the embodiment.
Figure 4B:
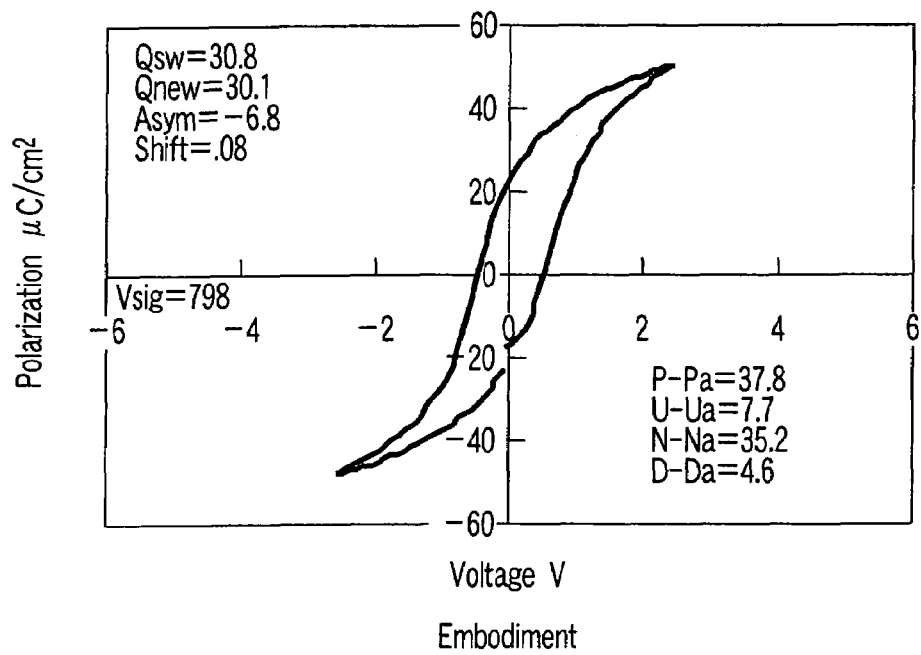

FIGS. 4A and 4B show hysteresis characteristics of a conventional PZT capacitor and the PZT capacitor according to the present embodiment. As shown in FIG. 4A, in the related art, the hysteresis is slightly rounded. It is understood that the hysteresis in FIG. 4A is sharply different from the hysteresis of the embodiment shown in FIG. 4B, which is close to a rectangular shape. This means that the related art includes a large leak component, compared to the present embodiment. A charge that is once induced cannot be retained, leading to considerable degradation in the reliability of, e.g. retention characteristics.

Figure 5:
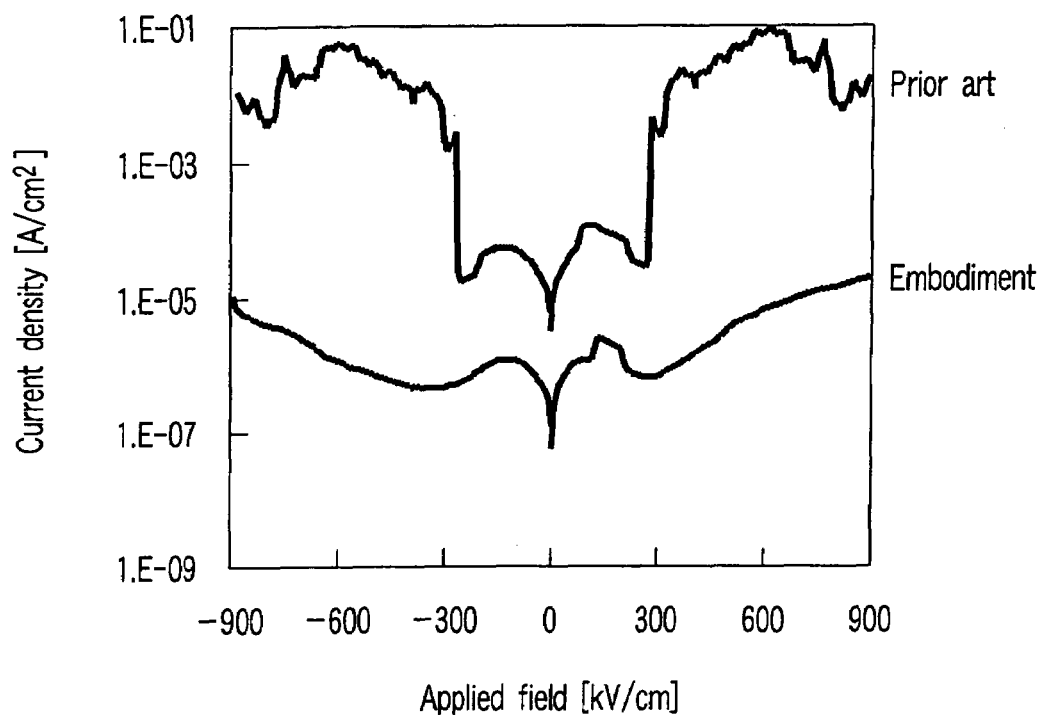
FIG. 5 is a graph showing leak current characteristics of the conventional PZT capacitor and the PZT capacitor according to the embodiment.
Figure 6:
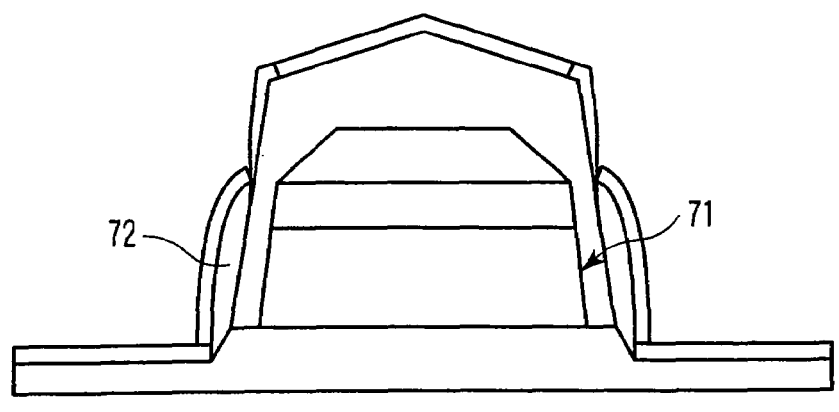
FIG. 6 shows a conventional capacitor.

FIG. 5 is a graph showing leak current characteristics of the related-art PZT capacitor and the PZT capacitor according to the embodiment. From the I-V characteristics of FIG. 5, it is understood that in the present embodiment, compared to the related art, the leak current density and the breakdown voltage are remarkably improved.

In the related art, in the capacitor that is provided in the semiconductor memory, in particular, in the capacitor that is formed of lead titanate perovskite compound expressed by $ABO_3$, noble metals such as Pt, Ir and Ru are generally used because these are thermally/chemically stable as electrode materials. However, because of the stability, volatile etching cannot easily be performed in the capacitor processing using RIE, and etched matter re-adheres to the peripheral part of the capacitor, in particular, the sidewalls of the capacitor. Consequently, residual matter that is called "fence" forms and electrical/structural problems arise.

In the present embodiment, attention has been paid to the phenomenon that no fence forms on each corner part of the capacitor that has a rectangular shape, when viewed from above. Specifically, the curvature of the sidewall and the length of the arc are defined with the taper angle being set at 85° or less. Thereby, a fence-free capacitor is realized.

The uniform curvature and the same arc are provided over the entire regions of the sidewalls of a capacitor. Thereby, the capacitor, when viewed in a lateral direction, has the uniform shape. Specifically, over all the side surfaces of the capacitor, sidewalls, whose radius of curvature is 250 [nm] or less and in which the length of the arc with the radius of curvature is $\{250 [nm] \times \pi/6 [rad]\}$ or less are successively provided. Hence, the formation of adhering residual matter is less affected by the change in etching conditions, and the stability in processing can be realized. Therefore, it becomes possible to increase the margin for etching conditions.

The capacitor according to the present embodiment is applicable to a ferroelectric memory (FeRAM) of an offset type or a chain type. The top view of the capacitor is not limited to that shown in FIG. 2. For example, a structure comprising two circles or a structure with different radius of curvature of two circles (i.e. "gourd" shape) may be adopted. Besides, in the above-described embodiment, the entire side surfaces of the capacitor have a predetermined radius of curvature and length of arc.

However, at least a part of the side surfaces of the capacitor may have such a radius of curvature and length of arc. More specifically, in the case of the structure that includes a part that does not function as a capacitor, the side surface of this part that does not function as a capacitor may not have such a radius of curvature and length of arc. Alternatively, it is also possible to adopt a structure wherein the upper electrode of the capacitor has a part which is not formed on the ferroelectric film.

According to the present embodiment, the leak current can be reduced and the breakdown voltage can be increased from the standpoint of electrical aspects. In the structural aspects, the step coverage of the $Al_2O_3$ cover film can be improved and the surface planarity can be enhanced in the CMP step that is performed after an interlayer insulation film is deposited. In addition, it is possible to realize high stability in processing of capacitors with small non-uniformity and high reproducibility.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A semiconductor device comprising:
    a semiconductor substrate; and
    a capacitor that is provided above the semiconductor substrate and is configured such that a dielectric film is sandwiched between a lower electrode and an upper electrode, the dielectric film being formed of an $ABO_3$ perovskite-type oxide that includes at least one of Pb, Ba and Sr as an A-site element and at least one of Zr, Ti, Ta, Nb, Mg, W, Fe and Co as a B-site element,
    wherein the capacitor comprises at least one sidewall, the at least one sidewall having a radius of curvature being 250 nm or less and an arc length being 250 nm or less, wherein an angle subtended by the arc length is $\pi/6$ rad, with the proviso that the radius of curvature and the arc length are not zero,
    wherein a taper angle of the at least one sidewall, relative to the semiconductor substrate, is 85° or less.

2. The semiconductor device according to claim 1, wherein the at least one sidewall is the entirety of side surfaces of the capacitor.

* * * * *